United States Patent
Asami

(10) Patent No.: US 6,597,507 B1
(45) Date of Patent: Jul. 22, 2003

(54) V-GROOVE GRATING MIRROR AND EXTERNAL RESONATOR TYPE WAVELENGTH VARIABLE LIGHT SOURCE USING THE MIRROR

(75) Inventor: Keisuke Asami, Kanagawa (JP)

(73) Assignee: Ando Electric Co., Ltd., Kanagawa (JP)

( * ) Notice: Subject to any disclaimer, the term of this patent is extended or adjusted under 35 U.S.C. 154(b) by 30 days.

(21) Appl. No.: 09/723,186

(22) Filed: Nov. 27, 2000

(30) Foreign Application Priority Data

Nov. 29, 1999 (JP) ............................................ 11-338536

(51) Int. Cl.[7] ............................ G02B 5/18; G02B 5/124; H01S 3/08
(52) U.S. Cl. ....................... 359/572; 359/369; 359/530; 372/99; 372/102; 372/107
(58) Field of Search .................................. 359/569, 571, 359/572, 831, 837, 530, 833; 372/21, 20, 107, 15, 99, 100, 102

(56) References Cited

U.S. PATENT DOCUMENTS

| | | | |
|---|---|---|---|
| 3,443,869 A | 5/1969 | Frank | 372/20 |
| 4,712,867 A * | 12/1987 | Malek | 359/530 |
| 4,801,193 A * | 1/1989 | Martin | 359/530 |
| 5,080,465 A * | 1/1992 | Laude | 359/571 |
| 5,319,668 A | 6/1994 | Luecke | |
| 5,594,744 A | 1/1997 | Lefevre et al. | |
| 5,811,173 A | 9/1998 | Eichhorn et al. | 428/167 |

FOREIGN PATENT DOCUMENTS

| | | | |
|---|---|---|---|
| EP | 0 490 279 A2 | 6/1992 | 362/260 |
| EP | 0 801 451 A2 | 10/1997 | |
| JP | 5-267768 | 10/1993 | |

* cited by examiner

*Primary Examiner*—Audrey Chang

(57) ABSTRACT

An external resonator type wavelength variable light source comprises a semiconductor laser 5 formed on one end face with a antireflection coating 5a, a lens 6 for converting emitted light from the end face of the semiconductor laser 5 formed with the antireflection coating 5a into collimated light, a diffraction grating 7 for selecting a wavelength of the collimated light provided through the lens 6 and diffracting the light, and a mirror for reflecting the light diffracted through the diffraction grating 7 and feeding back the light again diffracted through the diffraction grating 7 into the semiconductor laser 5 through the lens 6. A V-groove grating mirror 8 having reflecting faces with an arrangement like a grating, of a plurality of V grooves 2 each shaped like V at right angles in cross section in a base material 1 with a reflection coating 3 formed on the surface of each V groove is used as the mirror.

5 Claims, 4 Drawing Sheets

V-GROOVE GRATING MIRROR AND EXTERNAL RESONATOR TYPE WAVELENGTH VARIABLE LIGHT SOURCE USING THE MIRROR

BACKGROUND OF THE INVENTION

1. Field of the Invention

The invention relates to a V-groove grating mirror preferred for use with an external resonator type wavelength variable light source used in coherent light communication and a measurement technical fields and an external resonator type wavelength variable light source using the V-groove grating mirror.

2. Description of the Related Art

Available as an external resonator type wavelength variable light source is a light source of a placement technique called Rittman type wherein emission light from an end face of a side of a semiconductor laser where a antireflection coating is applied is converted into collimated light through a lens, a wavelength of the collimated light is selected through a diffraction grating for diffraction, and the diffracted light is reflected by a mirror and is again diffracted through the diffraction grating, then is fed back into the semiconductor laser through the lens (for example, refer to JP-A-5-267768, U.S. Pat. No. 5,319,668).

In the light source of the Rittman type placement technique as described above, if a general plane mirror 10 is placed at a normal position and light is fed back as shown in FIG. 7A, no problem arises; however, if an optical axis is inclined with respect to the plane mirror 10 or the plane mirror 10 is inclined with respect to the optical axis as shown in FIG. 7B, the reflected light goes in a different direction from the original optical path.

Therefore, hitherto, high accuracy has been required for placement of a mirror.

Likewise, a light source of Rittman type placement technique adopting a mirror whose surface is shaped like V at 90 degrees is known according to U.S. Pat. No. 5,594,744.

The mirror surface is shaped like V at 90 degrees, whereby if the V-shaped mirror 9 or an optical axis is inclined, light can be reflected in parallel with the original optical path because of the V-shaped surface of the mirror 9, as shown in FIG. 6A.

However, with the V-shaped mirror 9, as the incidence position of collimated light shifts from the center of the V-shaped surface, collimated (parallel) move distance of reflected light grows as shown in FIG. 6B and when the reflected light is fed back into a semiconductor laser (hereinafter, abbreviated as LD) 5 through a lens 6, the joint loss is increased as shown in FIG. 5; this is a problem.

SUMMARY OF THE INVENTION

It is an object of the invention to provide a V-groove grating mirror capable of providing reflected light as collimated light if the mirror or an optical axis is inclined and suppressing the collimated (parallel) move distance of reflected light to a small distance as much as possible.

It is also an object of the invention to provide an external resonator type wavelength variable light source using the V-groove grating mirror.

To the above ends, the invention according to first aspect is characterized by a V-groove grating mirror comprising reflecting faces with an arrangement like a grating, of a plurality of V grooves 2 each shaped like V at right angles in cross section on a base material 1, for example, as shown in FIG. 1.

In this way, according to the first aspect of the invention, the V-groove grating mirror comprises reflecting faces with an arrangement like a grating, of a plurality of V grooves each shaped like V at right angles in cross section, so that if the V-groove grating mirror or an optical axis is inclined, reflected light in parallel with the incidence light can be provided by means of the V-groove grating of the reflecting faces.

Moreover, a plurality of the V grooves are arranged like a grating at small pitches, so that the collimated (parallel) move distance of the reflected light can be suppressed to a small distance as compared with a V-shaped mirror in a related art.

The invention according to second aspect is characterized by the V-groove grating mirror according to the first aspect of the invention further comprising a reflection coating 3 formed on the surface of the V groove 2, for example, as shown in FIG. 1.

The invention according to third aspect is characterized by the fact that in the V-groove grating mirror according to the first aspect of the invention, the base material 1 is made of a light transmission material and the face opposed to the reflecting faces with the V grooves 2 arranged like a grating is an incidence plane 4, for example, as shown in FIG. 2.

According to the third aspect of the invention, the V-groove grating mirror is made of a light transmission material and the face opposed to the reflecting faces with the V grooves according to the first aspect of the invention arranged like a grating is an incidence plane, so that incidence light passing through an inside of the V-groove mirror is reflected by the V-groove grating and is emitted to an outside of the V-groove mirror.

The invention according to fourth aspect is characterized by the fact that in the V-groove grating mirror according to the first aspect of the invention, a pitch between one groove and the adjacent groove is in a range of from (d/1000) to d where d is the beam diameter of the incident light The invention according to fifth aspect is characterized by an external resonator type wavelength variable light source comprising:

a LD 5 formed on one end face with a antireflection coating 5a;

a lens 6 for converting emitted light from the end face of the LD 5 formed with the antireflection coating 5a into collimated light;

a diffraction grating 7 for selecting a wavelength of the collimated light provided through the lens 6 and diffracting the light; and a mirror for reflecting the light diffracted through the diffraction grating 7 and feeding back the light again diffracted through the diffraction grating 7 into the LD 5 through the lens 6, wherein a V-groove grating mirror according to the first, second, third, or fourth aspect of the invention is used as the mirror, for example, as shown in FIG. 3.

According to the fifth aspect of the invention, the external resonator type wavelength variable light source uses the v-groove grating according to the first, second, third or fourth aspect of the invention as the mirror for reflecting the light diffracted through the diffraction grating and feeding back the light again diffracted through the diffraction grating into the LD through the lens, so that optical axis adjustment and incidence position adjustment of the mirror become unnecessary, a self-correction of an optical axis shift accompanying wavelength varying can be made, and alignment becomes easy to make as compared with use of the V-shaped mirror in the related art.

The invention according to sixth aspect is characterized by the fact that in the external resonator type wavelength variable light source according to the fifth aspect of the invention, the grating of the V-groove grating mirror 8 is placed in a direction orthogonal to a grating direction of the diffraction grating 6, for example, as shown in FIG. 3.

According to the sixth aspect of the invention, in the external resonator type wavelength variable light source according to the fifth aspect of the invention, the grating of the V-groove grating mirror is placed in the direction orthogonal to the grating direction of the diffraction grating, so that the diffracted light whose wavelength is selected through the diffraction grating can be reliably fed back into the LD by means of the V-groove grating mirror.

BRIEF DISCRIPTION OF THE DRAWINGS

FIG. 6A is a side view to show the relationship with an optical path when the V-shaped mirror is placed at a normal position and FIG. 6B is a side view to show the relationship with the optical path when either of the V-shaped mirror and an optical axis is inclined.

FIG. 7A is a side view to show a relationship with an optical path when the plane mirror is placed at a normal position and FIG. 7B is a side view to show the relationship with the optical path when either of the plane mirror and an optical axis is inclined.

DETAILED DISCRIPTION OF THE PREFFERED EMBODIMENTS

Referring now to the accompanying drawings (FIGS. 1 to 4), there are shown preferred embodiments of a V-groove grating mirror and an external resonator type wavelength variable light source using the V-groove grating mirror according to the invention.

First, structure of the V-groove grating mirror will be discussed.

First Embodiment

Figure 1:
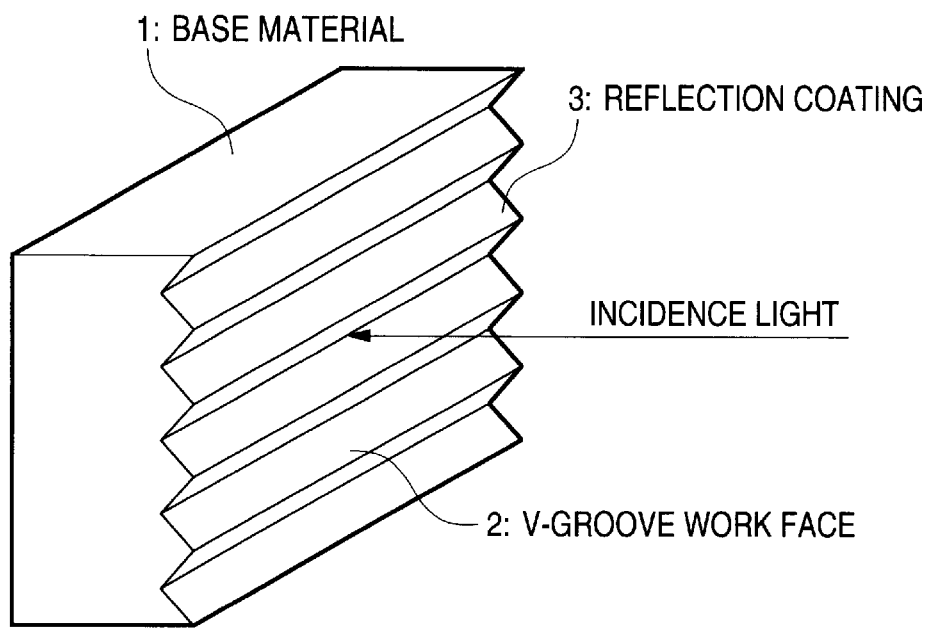
FIG. 1 is a perspective view to show a schematic structure of a V-groove grating mirror as an example incorporating the invention.

FIG. 1 is a perspective view to show a schematic structure of a V-groove grating mirror as an example incorporating the invention. In the figure, numeral 1 denotes a base material, numeral 2 denotes a V-groove work face (V groove) , and numeral 3 denotes a reflection coating.

As shown in the figure, the V-groove grating mirror comprises an arrangement like a grating, of a plurality of the V-groove work faces 2 (in the example shown five) each shaped like V in cross section with the inner angle of the V shape set to right angle (90 degrees) on one face of the base material 1 of a glass material, etc., and the reflecting films 3 formed on the V-groove work faces 2 as reflecting faces.

With the V-groove grating mirror, incidence light is incident on the reflection coating 3 on the V-groove work faces 2 and is reflected, as shown in the figure Incidentally, the reflection coating 3 is made of aluminum (Al), gold (Au) or dielectric multilayer ($SiO_2$ multilayer)

Second Embodiment

Figure 2:
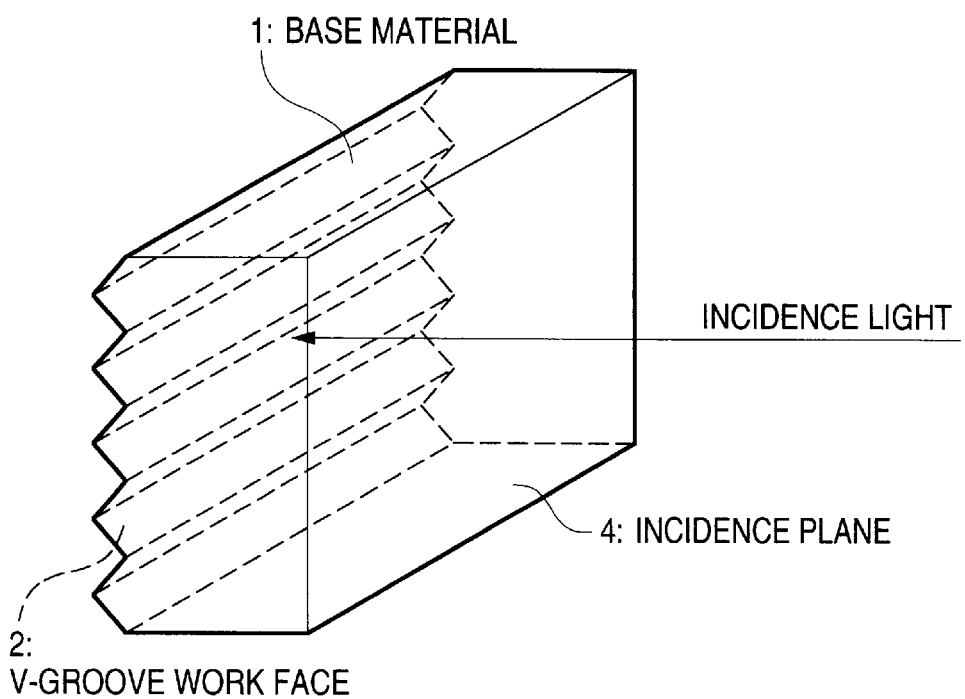
FIG. 2 is a perspective view to show a schematic structure of a V-groove grating mirror as another example incorporating the invention.

FIG. 2 is a perspective view to show a schematic structure of a V-groove grating mirror as another example incorporating the invention. In the figure, numeral 1 denotes a base material, numeral 2 denotes a V-groove work face (V groove), and numeral 4 denotes an incidence plane.

As shown in the figure, the V-groove grating mirror comprises an arrangement like a grating, of a plurality of the V-groove work faces 2 (in the example shown in the example, five) each shaped like V in cross section with the inner angle of the V shape set to right angle (90 degrees) on one face of the base material 1 of a light transmission material such as an optical glass and the incidence plane 4 of the face opposed to the V-groove work faces 2 as reflecting faces.

With the V-groove grating mirror, incidence light passing through the base material 1 from the incidence plane 4 is reflected by the V-groove work faces 2, as shown in the figure.

Next, a light source using the V-groove grating mirror as described above will be discussed.

Application example of V-groove grating mirror

A description is given by taking an external resonator type wavelength variable light source using a LD as an example, but the V-groove grating mirror of the invention can also be applied to a solid laser, etc.

In the V-groove grating mirror of the invention, V-groove grating pitch P is practical in the range of (d/1000) to d, preferably (d/100) to (d/3), if the beam diameter of the collimated light is d. In the embodiments, the beam diameter of collimated light d is 2 mm and the V-groove grating pitch P is (d/20).

Figure 3:
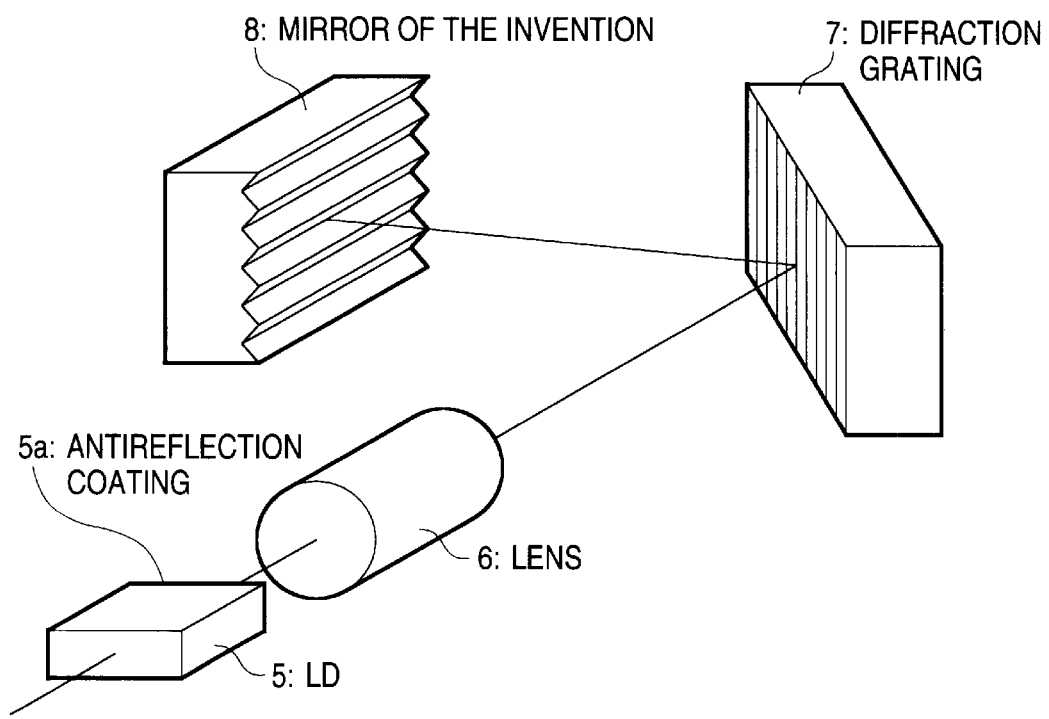
FIG. 3 is a perspective view to show a schematic configuration of an external resonator type wavelength variable light source incorporating the invention.

FIG. 3 is a perspective view to show a schematic configuration of an external resonator type wavelength variable light source incorporating the invention. In the figure, numeral 5 denotes a LD, numeral 5a denotes an antireflection coating, numeral 6 denotes a lens, numeral 7 denotes a diffraction grating, and numeral 8 denotes a V-groove grating mirror.

As shown in the figure, the light source uses the V-groove grating mirror 8 shown in FIG. 1 as a mirror according to the Rittman type placement technique combined with the LD 5, the lens 6, and the diffraction grating 7, but may use the V-groove grating mirror shown in FIG. 2.

The V-groove grating mirror 8 comprises the grating of V-groove 2 placed in a direction orthogonal to the grating direction of the diffraction grating 7, as shown in the figure.

Since the V-groove grating mirror 8 comprising a plurality of the V-grooves 2 worked like a grating with the pitch of the V-grooves 2 made small with respect to the beam diameter of collimated light is used, if collimated light (diffracted light through the diffraction grating 7) is incident on any of the V-grooves 2 at small pitches, reflected light collimated (parallel) with the incidence light can be provided and the collimated (parallel) move distance of the reflected light can also be suppressed to a very smaller distance as compared with a V-shaped mirror in a related art.

Therefore, if the mirror 8 or the optical axis is inclined, the diffracted light whose wavelength is selected through the diffraction grating 7 can also be reliably fed back into the LD 5 by means of the V-groove grating mirror 8.

Figure 4:
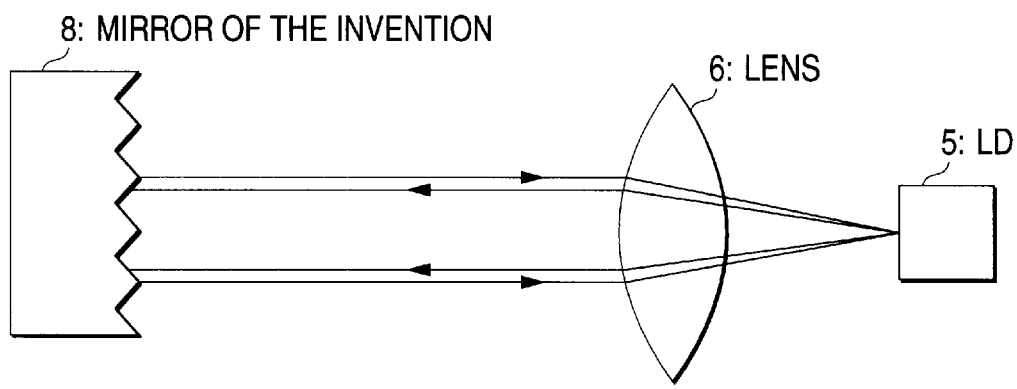
FIG. 4 is a side view to plainly show a relationship among the V-groove grating mirror of the invention, a LD, and a lens.
Figure 5:
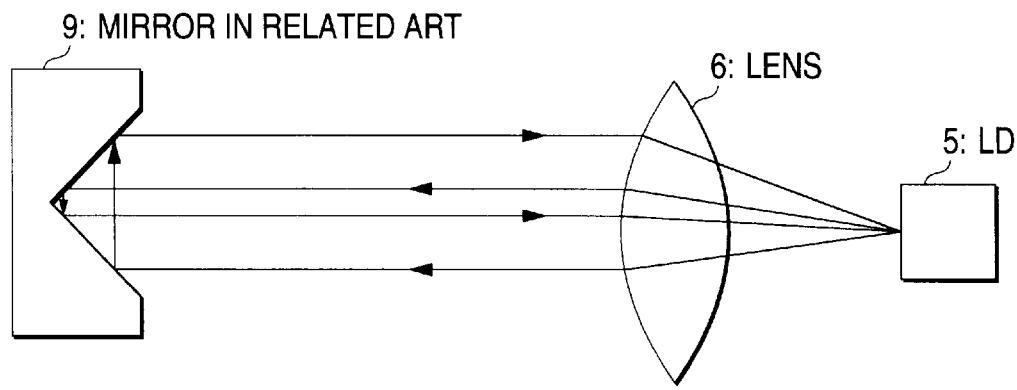
FIG. 5 is a side view to plainly show a relationship among a V-shaped mirror in a related art, an LD, and a lens.
Figure 6A:
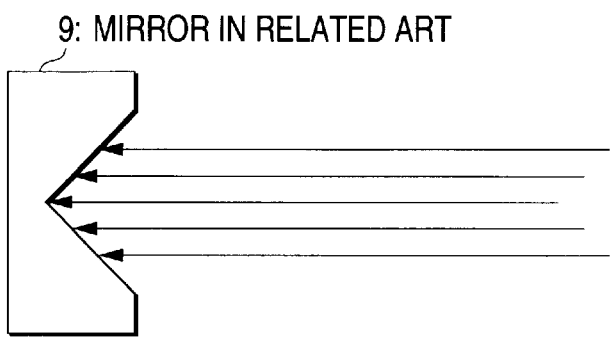
FIGS. 6A and 6B show a V-shaped mirror in a related art.
Figure 6B:
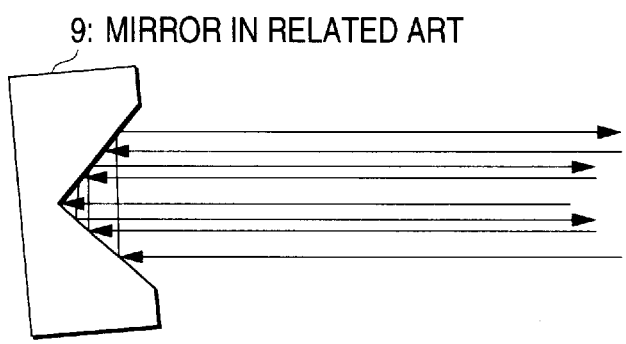
Figure 7A:
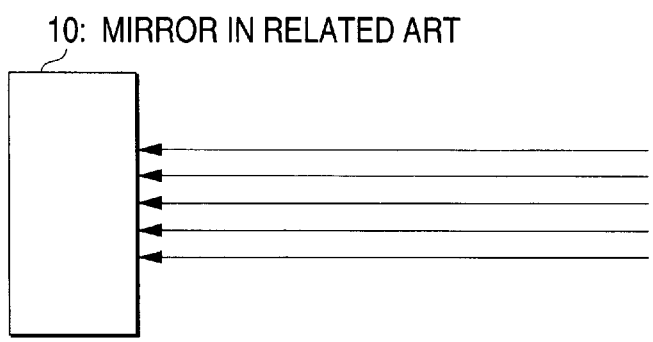
FIGS. 7A and 7B show a plane mirror in a related art.
Figure 7B:
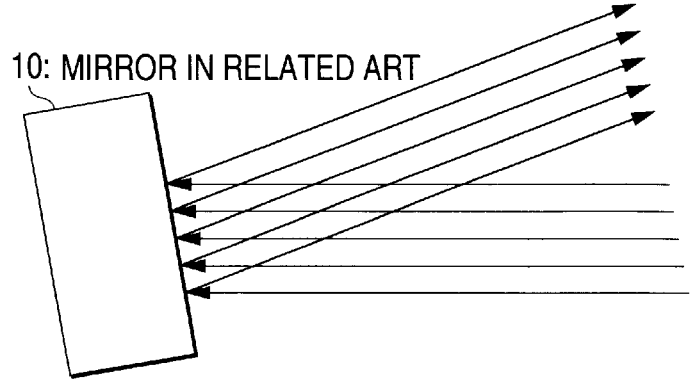

FIG. 4 plainly shows the relationship among the V-groove grating mirror 8, the LD 5, and the lens 6. The V-groove grating mirror 8 makes it possible to solve the problem involved in the V-shaped mirror 9 in the related art, namely, the problem of an increase in the joint loss when light is fed back into the LD 5 through the lens 6.

According to the external resonator type wavelength variable light source using the V-groove grating mirror 8, the following advantages can be provided:

(1) Since the collimated (parallel) move distance of the optical axis is small, optical axis adjustment in the up and down direction in the figure is not required.
(2) Since the collimated (parallel) move distance of the optical axis is small, incidence position adjustment of the mirror 8 is not required.
(3) A self-correction of an optical axis shift in the up and down direction in the figure accompanying wavelength varying can be made.
(4) Alignment is easy to make as compared with the V-shaped mirror 9 in the related art.

In the described embodiments, the V-groove grating mirror comprises an arrangement of five V-grooves, but the invention is not limited to it; the number of V-grooves is arbitrary and the V-groove grating mirror may comprise an arrangement of at least two or more V-grooves.

The material, shape, application, and the like of the V-groove grating mirror are also arbitrary and the specific detailed structure, etc., can also be changed wherever necessary, needless to say.

As described above, according to the V-groove grating mirror according to the invention of a first aspect, if the mirror or the optical axis is inclined, reflected light parallel with incidence light can be provided by means of the V-groove grating and the collimated (parallel) move distance of the reflected light can be suppressed to a small distance as compared with the V-shaped mirror in the related art.

According to the external resonator type wavelength variable light source according to the invention as claimed in claim 4, the V-groove grating mirror is used, whereby both optical axis adjustment and incidence position adjustment of the mirror become unnecessary, a self-correction of an optical axis shift accompanying wavelength varying can be made, and facilitating of alignment can be accomplished as compared with use of the V-shaped mirror in the related art.

What is claimed is:

1. An external resonator type wavelength variable light source comprising:

a semiconductor laser having a antireflection coating at one end face of the semiconductor laser, the semiconductor laser emitting a beam of Light from the one end face;

a lens adapted to convert the beam of light from the semiconductor laser into a collimated light beam;

a diffraction grating adapted to select a wavelength of the collimated light beam and diffract the collimated light beam; and a mirror adapted to reflect the collimated light beam from the diffraction grating and return the collimated light beam to the diffraction grating, whereby the collimated light beam is diffracted on the diffraction grating and fed back into the semiconductor laser through the lens, wherein the mirror comprises a base member having a reflecting surface;

the reflecting surface defines a plurality of grooves in the V-shape at right angle; and the plurality of grooves of the mirror are arranged in parallel.

2. The external resonator wavelength variable light source according to claim 1, wherein the reflecting surface of the mirror is coated for light reflection.

3. The external resonator wavelength variable light source according to claim 1, wherein the member of the mirror is made of a light transmission material and the collimated light beam is introduced into a face opposed to the reflecting surface of the mirror having the grooves.

4. The external resonator wavelength variable light source according to claim 1, wherein a pitch between one groove of the mirror and the adjacent groove of the mirror is in a range of from (d/1000) to d where d is the diameter of the collimated light beam.

5. The external resonator wavelength variable light source according to claim 1, wherein the mirror is placed so that the grooves of the mirror extend in a direction orthogonal to a direction in which grooves of the diffraction grating extend.

* * * * *